(12) United States Patent
Tabata

(10) Patent No.: US 12,325,919 B2
(45) Date of Patent: Jun. 10, 2025

(54) APPARATUS FOR PROCESSING SUBSTRATE

(71) Applicant: TOKYO ELECTRON LIMITED, Tokyo (JP)

(72) Inventor: Masahiro Tabata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 788 days.

(21) Appl. No.: 17/000,090

(22) Filed: Aug. 21, 2020

(65) Prior Publication Data

US 2021/0025060 A1    Jan. 28, 2021

Related U.S. Application Data

(62) Division of application No. 16/010,800, filed on Jun. 18, 2018, now Pat. No. 10,781,519.

(51) Int. Cl.
| | |
|---|---|
| *C23C 16/52* | (2006.01) |
| *C23C 16/24* | (2006.01) |
| *C23C 16/26* | (2006.01) |
| *C23C 16/455* | (2006.01) |
| *C23C 16/507* | (2006.01) |

(Continued)

(52) U.S. Cl.
CPC .............. *C23C 16/52* (2013.01); *C23C 16/24* (2013.01); *C23C 16/26* (2013.01); *C23C 16/45536* (2013.01); *C23C 16/507* (2013.01); *C23C 16/56* (2013.01); *H01J 37/32082* (2013.01); *H01J 37/3244* (2013.01); *H01J 37/32715* (2013.01); *H01J 37/32899* (2013.01); *H01L 21/306* (2013.01); *H01J 2237/3321* (2013.01); *H01J 2237/334* (2013.01); *H01L 21/02274* (2013.01); *H01L 21/0228* (2013.01); *H01L 21/31116* (2013.01)

(58) Field of Classification Search
None
See application file for complete search history.

(56) References Cited

U.S. PATENT DOCUMENTS

| | | | |
|---|---|---|---|
| 6,028,008 A | 2/2000 | Bayer | |
| 6,794,290 B1 | 9/2004 | Papasouliotis | |
| (Continued) | | | |

FOREIGN PATENT DOCUMENTS

CN          106148918 A          11/2016

OTHER PUBLICATIONS

Communication dated Feb. 28, 2023 from the Japanese Patent Office in Application No. 2019-090801.

*Primary Examiner* — Ram N Kackar
(74) *Attorney, Agent, or Firm* — Sughrue Mion, PLLC

(57) ABSTRACT

An apparatus for processing a substrate is provided. The apparatus includes a processing apparatus and a controller. The processing apparatus includes a chamber. The controller includes a memory and a processor coupled to the memory. The memory stores computer-executable instructions for controlling the processor to control a process of the processing apparatus. The process includes first forming a first film in a first region of the substrate in the chamber by chemical vapor deposition. The process further includes second forming a second film in a second region of the substrate in the chamber by atomic layer deposition. The first forming and the second forming are performed without moving the substrate out of the chamber.

18 Claims, 5 Drawing Sheets

(51) Int. Cl.
  *C23C 16/56* (2006.01)
  *H01J 37/32* (2006.01)
  *H01L 21/306* (2006.01)
  *H01L 21/02* (2006.01)
  *H01L 21/311* (2006.01)

(56) References Cited

U.S. PATENT DOCUMENTS

| | | |
|---|---|---|
| 7,476,621 B1 | 1/2009 | Nguyen |
| 8,153,535 B1 | 4/2012 | Shanker |
| 9,716,005 B1* | 7/2017 | Godet ............... H01L 21/3105 |
| 10,037,884 B2 | 7/2018 | Ou |
| 10,361,076 B2 | 7/2019 | Kang |
| 10,381,236 B2 | 8/2019 | Kihara |
| 2002/0004309 A1 | 1/2002 | Collins |
| 2005/0087130 A1* | 4/2005 | Derderian ......... C23C 16/45544 427/248.1 |
| 2006/0211223 A1* | 9/2006 | Brcka ............... C23C 16/45538 257/E21.171 |
| 2006/0211243 A1* | 9/2006 | Ishizaka ............ H01L 21/76843 257/E21.171 |
| 2007/0257368 A1 | 11/2007 | Hussein |
| 2007/0298583 A1 | 12/2007 | Wu |
| 2009/0246971 A1 | 10/2009 | Reid |
| 2010/0173494 A1 | 7/2010 | Kobrin |
| 2011/0049716 A1 | 3/2011 | Yang |
| 2011/0135842 A1 | 6/2011 | Faguet |
| 2017/0117134 A1 | 4/2017 | Henri et al. |
| 2018/0061628 A1 | 3/2018 | Ou |
| 2018/0076087 A1 | 3/2018 | Yamauchi |
| 2018/0166270 A1 | 6/2018 | Cho et al. |
| 2019/0115254 A1 | 4/2019 | Sheu |
| 2019/0157096 A1 | 5/2019 | Zhou |

* cited by examiner

APPARATUS FOR PROCESSING SUBSTRATE

CROSS REFERENCE TO RELATED APPLICATIONS

This is a Divisional of application Ser. No. 16/010,800 filed Jun. 18, 2018, the contents of all of which are incorporated herein by reference in their entirety.

FIELD

An exemplary embodiment disclosed herein relates to a method and apparatus for processing substrates.

BACKGROUND

Various deposition techniques are known. For example, chemical vapor deposition (CVD) utilizes the reaction or decomposition of gaseous species to form a solid film on a surface of a substrate. Atomic Layer Deposition (ALD), which can be viewed as one type of CVD, has a unique property of being intrinsically conformal.

While various techniques have been developed to increase the integration and miniaturization of semiconductor devices, further demand for device integration and miniaturization calls for an even more precise control of patterning.

SUMMARY

According to one embodiment, an apparatus for processing a substrate includes a processing apparatus and a controller. The processing apparatus includes a chamber. The controller includes a memory and a processor coupled to the memory. The memory stores computer-executable instructions for controlling the processor to control a process of the processing apparatus. The process includes first forming a first film in a first region of the substrate in the chamber by chemical vapor deposition. The process further includes second forming a second film in a second region of the substrate in the chamber by atomic layer deposition. The first forming and the second forming are performed without moving the substrate out of the chamber.

According to one embodiment, an apparatus for processing a substrate includes a processing apparatus and a controller. The processing apparatus includes a chamber. The controller includes a memory and a processor coupled to the memory. The memory stores computer-executable instructions for controlling the processor to control a process. The process includes first forming a first film in a first region of the substrate in the chamber by chemical vapor deposition. The process further includes second forming a second film in a second region of the substrate in the chamber by atomic layer deposition. The process further includes etching the substrate. The first forming, the second forming, and the etching are performed without moving the substrate out of the chamber.

According to one embodiment, a method of processing a substrate includes first forming, by chemical vapor deposition, a first film in a first region of the substrate in a chamber of a processing apparatus. The method further includes second forming, by atomic layer deposition, a second film in a second region of the substrate in the chamber. The first forming and the second forming are performed without moving the substrate out of the chamber.

BRIEF DESCRIPTION OF DRAWINGS

A more complete appreciation of the present application and many of the attendant advantages thereof will be readily obtained as the same becomes better understood by reference to the following detailed description when considered in connection with the accompanying drawings, wherein.

DESCRIPTION OF EMBODIMENTS

An exemplary embodiment of a method and apparatus for processing a substrate disclosed in the present application will be described below in detail with reference to the accompanying drawings. The illustrative embodiment disclosed below is not intended to be limiting in any ways.

Exemplary Apparatus

Figure 1:
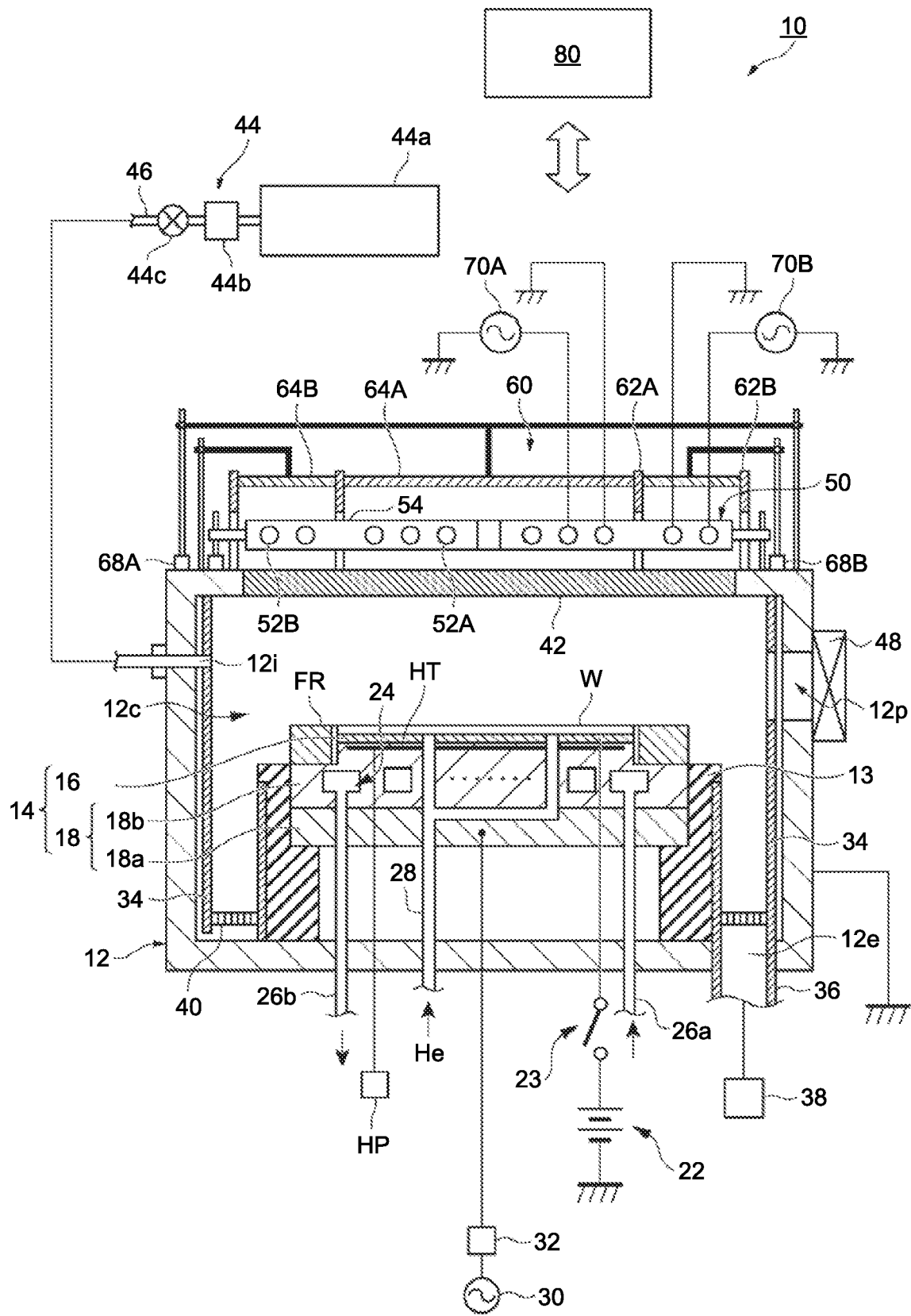
FIG. 1 is a cross-sectional view schematically illustrating an exemplary processing apparatus according to one embodiment.

FIG. 1 is a diagram illustrating a schematic configuration of a processing apparatus 10 according to one embodiment. The processing apparatus 10 is an example of the apparatus for processing a substrate according to one embodiment. The processing apparatus 10 of FIG. 1 can be utilized to implement a method carried out according to one embodiment. The processing apparatus 10 of FIG. 1 is a so-called inductively-coupled plasma (ICP) apparatus which includes a plasma source for generating inductively-coupled plasma. However, the apparatus according to one embodiment may utilize plasma generated by other means. For example, the apparatus according to one embodiment may be an apparatus utilizing capacitively-coupled plasmas (CCP), electron cyclotron resonance plasmas (ECR), helicon wave plasmas (HWP), or surface wave plasmas (SWP), for example.

The processing apparatus 10 includes a chamber 12. The chamber 12 is made of a metal such as aluminum. The chamber 12 is, for example, substantially cylindrical in shape. Inside the chamber 12, a space 12c is provided and in which a process takes place.

At the bottom side of the space 12c, a stage 14 is arranged. The stage 14 is configured to hold a workpiece W mounted thereon. The workpiece W is, for example, a substrate to be processed by the method according to one embodiment.

The stage 14 can be supported by a support mechanism 13. The support mechanism 13 extends from the bottom of the chamber 12 upward in the space 12c. The support mechanism 13 may be substantially cylindrical in shape. The support mechanism 13 may be made of insulating material such as quartz.

The stage 14 includes an electrostatic chuck 16 and a lower electrode 18. The lower electrode 18 includes a first plate 18a and a second plate 18b. The first plate 18a and the second plate 18b are made of a metal such as aluminum. The first plate 18a and the second plate 18b are substantially cylindrical in shape, for example. The second plate 18b is arranged on the first plate 18b. The second plate 18b is electrically connected to the first plate 18a.

The electrostatic chuck 16 is arranged on the second plate 18b. The electrostatic chuck 16 includes an insulating layer and a film electrode placed inside the insulating layer. To the film electrode of the electrostatic chuck 16, a direct-current source 22 is electrically connected via a switch 23. The electrostatic chuck 16 generates electrostatic force from the direct-current voltage of the direct-current source 22. The electrostatic chuck 16 attracts and holds the workpiece W by the electrostatic force.

During the operation of the processing apparatus 10, a focus ring FR is placed on and around the periphery of the second plate 18b such that the focus ring FR surrounds the edges of the workpiece W and the electrostatic chuck 16. The focus ring FR serves to improve the uniformity of the process. The focus ring FR is made of quartz, for example.

In the second plate 18b, a flow channel 24 is formed. To the flow channel 24, a heat exchange medium such as a cooling medium is supplied from a temperature adjuster (e.g., chiller unit) arranged outside the chamber 12 for temperature control. The temperature adjuster adjusts the temperature of the heat exchange medium. The heat exchange medium is supplied from the temperature adjuster through a pipe 26a to the flow channel 24. The heat exchange medium supplied to the flow channel 24 via the pipe 26a from the temperature adjuster is made to return to the temperature adjuster via a pipe 26b. The heat exchange medium is supplied to the flow channel 24 in the stage 13 after the temperature of the heat exchange medium is adjusted by the temperature adjuster. Thus, the temperature of the stage 14, and therefore, the temperature of the workpiece W can be adjusted.

The processing apparatus 10 further includes a gas supply line 28 which extends through the stage 14 up to the upper surface of the electrostatic chuck 16. To the space between the upper surface of the electrostatic chuck 16 and the lower surface of the workpiece W, a heat transfer gas, such as He gas is supplied from a heat transfer gas supply mechanism via the gas supply line 28. Thus, the heat exchange between the stage 14 and the workpiece W is facilitated.

A heater HT may be arranged inside the stage 14. The heater HT is a heating device. The heater HT is embedded inside the second plate 18b, or the electrostatic chuck 16, for example. The heater HT is connected to a heater power source HP. The heater power source HP supplies electricity to the heater HT, so that the temperature of the stage 14, and hence, the temperature of the workpiece W is adjusted.

To the lower electrode 18 of the stage 14, a radio-frequency (RF) power source 30 is connected via a matching device 32. A radio-frequency current may be supplied from the RF power source 30 to the lower electrode 18. The RF power source 30 generates an RF current to draw ions into the workpiece W mounted on the stage 14. In other words, the RF power source 30 generates a RF current to be used as a bias voltage. The frequency range of the RF current generated by the RF power source 30 is, for example, within the range of 400 [kHz] to 40.68 [MHz]. In one example, the frequency is 13.56 [MHz].

The matching device 32 includes a circuit for matching the impedance of the output from the RF power source 30 and the impedance on a load side, i.e., on the side of the lower electrode 18. The processing apparatus 10 can generate plasma simply by supplying the radio-frequency voltage to the lower electrode 18 without using an additional source generating a radio-frequency current for plasma generation.

The processing apparatus 10 further includes a shield 34 detachably attached to the inner wall of the chamber 12. The shield 34 is further arranged to an outer periphery of the support mechanism 13. The shield 34 serves to prevent the by-product of the process from adhering to the chamber 12. The shield 34 may be an aluminum member coated with ceramics such as $Y_2O_3$.

An exhaust channel is formed between the stage 13 and the sidewall of the chamber 12. The exhaust channel is connected to an exhaust port 12e formed in the bottom of the chamber 12. The exhaust port 12e is connected via a pipe 36 to an exhaust device 38. The exhaust device 38 includes a pressure adjuster and a vacuum pump such as a turbomolecular pump (TMP). A baffle 40 is arranged in the middle of an exhaust path, i.e., between the stage 14 and the sidewall of the chamber 12. The baffle 40 has a plurality of penetration holes penetrating the baffle 40 in a thickness direction. The baffle 40 may be an aluminum member whose surface is coated with ceramics such as $Y_2O_3$.

In the upper side of the chamber 12, an opening is formed. The opening is closed by a window 42. The window 42 is made of a dielectric such as quartz. The window 42 is a flat plate, for example.

In the sidewall of the chamber 12, a gas inlet 12i is formed. The gas inlet 12i is connected to a gas supply unit 44 via a pipe 46. The gas supply unit 44 supplies various gases used for the process to the space 12c. The gas supply unit 44 includes a plurality of gas sources 44a, a plurality of flow controllers 44b, and a plurality of valves 44c. Though not specifically illustrated in FIG. 1, a plurality of gas inlets may be provided for each gas such that gases do not mix with each other.

The plurality of gas sources 44a include sources of various gases described later. One gas source may provide more than one gas. The plurality of flow controllers may be a mass flow controller (MFC), flow controllers realizing the control through pressure control. Each gas source included in the plurality of gas sources 44a is connected to the gas inlet 12i via a corresponding one of the plurality of flow controllers 44b, and a corresponding one of the plurality of valves 44c. The position of the gas inlet 12i is not particularly limited. For example, the gas inlet 12i may be formed in the window 42 instead of the sidewall of the chamber 12.

In the sidewall of the chamber 12, an opening 12p is formed. The opening 12p provides a path for the workpiece W imported from outside the chamber 12 to the space 12c, and exported from inside the space 12c to the outside of the chamber 12. On the sidewall of the chamber 12, a gate valve 48 is provided to allow the opening/closing of the opening 12p.

Above the chamber 12 and the window 42, an antenna 50 and a shield 60 are provided. The antenna 50 and the shield 60 are arranged outside the chamber 12. In one embodiment, the antenna 50 includes an internal antenna element 52A and an external antenna element 52B. The internal antenna element 52A is a spiral coil arranged at the center of the window 42. The external antenna element 52B is a spiral coil arranged on the window 42 and outside the internal antenna element 52A. Each of the internal antenna element 52A and the external antenna elements 52B is made of a conductive material such as copper, aluminum, and stainless steel.

The internal antenna element 52A and the external antenna element 52B are clamped and held together by a plurality of clamps 54. Each of the plurality of clamps 54 has a rod-like shape. The plurality of clamps 54 extend radially from approximately the center of the internal antenna element 52A to the outside of the external antenna element 52B.

The shield 60 covers the antenna 50. The shield 60 includes an inner shield wall 62A and an outer shield wall 62B. The inner shield wall 62A is cylindrical in shape. The inner shield wall 62A is arranged between the internal antenna element 52A and the external antenna element 52B so as to surround the internal antenna element 52A. The outer shield wall 62B is cylindrical in shape. The outer shield wall 62B is arranged outside the external antenna element 52B so as to surround the external antenna element 52B.

Above the internal antenna element 52A, a disk-like inner shield plate 64A is arranged, so as to cover the opening of the inner shield wall 62A. Above the external antenna element 52B, an external shield plate 64B, which is a ring-like plate, is arranged, so as to cover the opening between the inner shield wall 62A and the outer shield wall 62B.

The shapes of the shield wall and the shield plate included in the shield 60 are not limited to the shape described above. For example, the shield wall of the shield 60 may be a square pillar.

The internal antenna element 52A and the external antenna element 52B are connected to a radio-frequency (RF) power source 70A and a radio-frequency (RF) power source 70B, respectively. The internal antenna element 52A and the external antenna element 52B receive a current supply of the same or different frequency from the RF power source 70A and the RF power source 70B, respectively. When the RF power is supplied from the RF power source 70A to the internal antenna element 52A, an inductive magnetic field is generated inside the space 12c, to excite the gas in the space 12c and generate plasma above the center of the workpiece W. On the other hand, when the RF power is supplied from the RF power source 70B to the external antenna element 52B, an inductive magnetic field is generated in the space 12c, to excite the gas in the space 12c and generate ring-like plasma above the periphery of the workpiece W.

The electrical length of each of the internal antenna element 52A and the external antenna element 52B is adjusted according to the frequency of the output from the RF power source 70A and the RF power source 70B. Hence, the positions of the inner shield plate 64A and the outer shield plate 64B in Z-axis direction are adjusted independently by an actuator 68A and an actuator 68B, respectively.

The processing apparatus 10 may further include a controller 80. The controller 80 may be a computing device equipped with a processor, storage such as a memory, input device, and display, for example. The controller 80 operates according to a control program and recipe data stored in the storage to control various elements of the processing apparatus 10. For example, the controller 80 controls: the plurality of flow controllers 44b, the plurality of valves 44c, the exhaust device 38, the RF power source 70A, the RF power source 70B, the RF power source 30, the matching device 32, and the heater power source HP. The controller 80 may control various elements of the processing apparatus 10 according to the control program and the recipe data when implementing the method according to one embodiment.

Exemplary Process Flow

Figure 2:
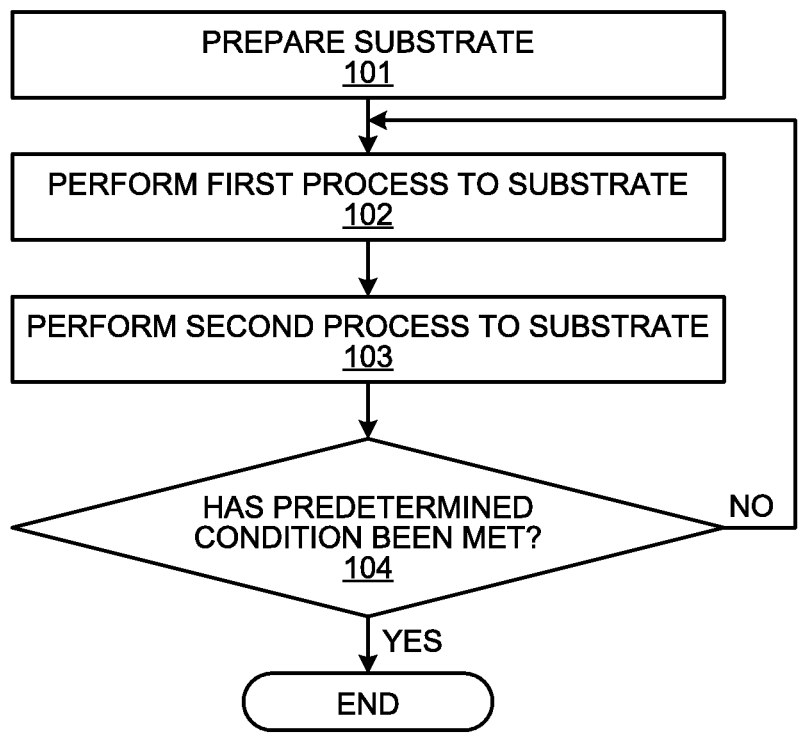
FIG. 2 is a flowchart illustrating an exemplary method according to one embodiment.

FIG. 2 is a flowchart illustrating an exemplary method according to one embodiment. According to one embodiment, workpiece W, such as a semiconductor substrate is processed by the processing apparatus 10.

In operation 101, the substrate is prepared for the process according to one embodiment. In one embodiment, the substrate may be transferred into the chamber 12, and mounted on and held by the electrostatic chuck 16. Further, a preparatory process may be performed on the substrate. For example, if the surface of the substrate does not have a uniform property, a process to make the surface of the substrate uniform may be performed. The substrate to be processed may be made of silicon dioxide ($SiO_2$), silicon nitride (SiN), or germanium (Ge). However, the substrate may contain other materials as far as it has a hydrophilic surface or a surface subjected to hydrophilic treatment. The substrate may have features such as a via, trench or contact hole. The features of the substrate may be formed by etching. The substrate may be a Si substrate. In the etching, halogen gases such as HBr may be used. The etching may be performed in the same chamber as the one where subsequent processes, i.e., a first process and a second process to be described later, take place. The etching may be performed in a different chamber.

Then, in operation 102, the controller 80 controls the processing apparatus 10 to perform the first process. The first process is performed on the substrate to form a first film in a first region thereon. In one embodiment, the first process is a chemical vapor deposition (CVD) process. The first process may be a plasma-enhanced CVD. However, the first process may be performed without the use of plasma.

In the first process, a first gas is introduced into the chamber 12 via the gas supply unit 44. The controller 80 controls the RF power source 30 to supply an RF current to the lower electrode 18. The first gas turns into a plasma state and deposits on the surface of the substrate to form the first film thereon.

The first gas may include carbon. The first gas is, for example, fluoro-carbon gas, hydro-fluoro carbon gas, and hydro carbon gas. For example, $CF_4$, $C_4F_6$, $C_4F_8$, $CH_2F_2$, $CHF_3$, $CH_4$ and others may be usable. Films of plasma polymerized fluorocarbons (PPFC) are hydrophobic and suitable as the first film of the embodiment. However, the first gas may be any gas as far as it can form a hydrophobic film on the hydrophilic surface of the substrate. In addition, it is desirable that the hydrophobic film formed by the first gas is removable by a second process described later. In the first process, the first gas may contain an inert gas such as a nitrogen ($N_2$) gas and an argon (Ar) gas as a carrier gas.

Figure 3A:
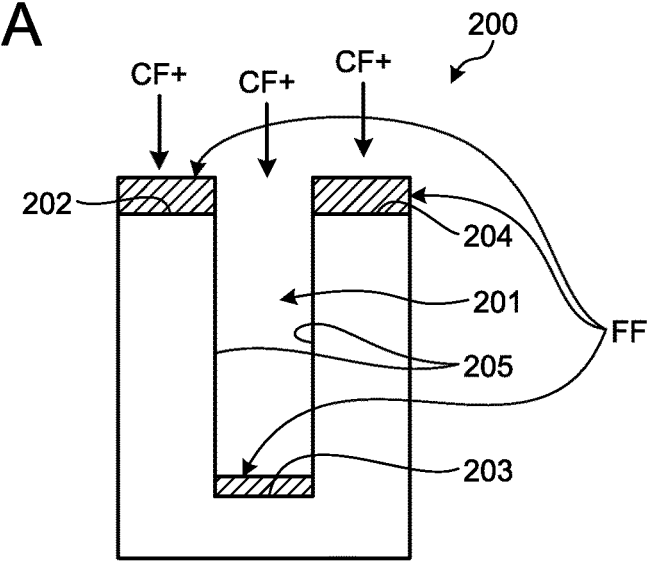
FIGS. 3A to 3C are exemplary diagrams of a substrate processed according to one embodiment.
Figure 4A:
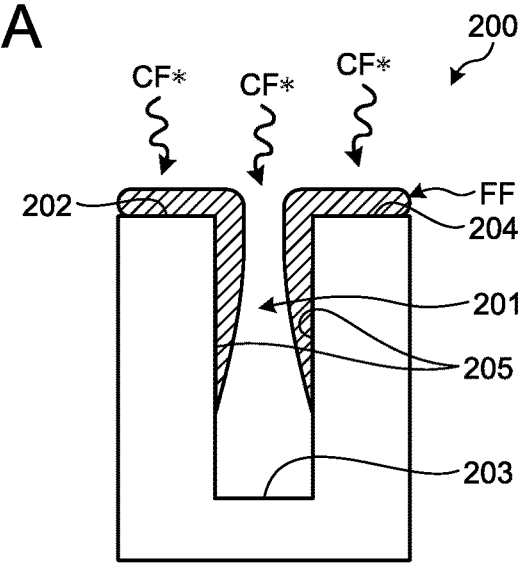
FIGS. 4A to 4C are exemplary diagrams of a substrate processed according to one embodiment.

The first film may be formed in the first region of the substrate. The position of the first region may be determined based on the features of the substrate. The position of the first region may also be determined based on the type of the first process, i.e., whether it is an anisotropic CVD or an isotropic CVD. FIG. 3A is an exemplary diagram of a substrate processed according to one embodiment. In FIG. 3A, a substrate 200 has a trench 201. The size of the opening of the trench 201 is approximately the same at the upper portion and the bottom portion. When an anisotropic CVD is performed on the substrate 200, the first film FF, such as CFx is deposited on regions 202, 203, 204 as illustrated in FIG. 3A; in other words, the first film, which is indicated as FF in FIGS. 3A and 4A, is formed in the top regions 202 and 204, and in the bottom region 203, but not on the sidewall region 205. In the anisotropic CVD, the material is deposited mainly in one direction. In an example of FIG. 3A, the CFx is deposited in a vertical direction but not in a horizontal direction. Here, the vertical direction indicates a direction perpendicular to the surface of the substrate 200, and the horizontal direction indicates a direction parallel to the surface of the substrate 200. Thus, the first film FF is not formed on the sidewall region 205. However, the first film FF may be deposited on the sidewall region 205 by an amount smaller than an amount deposited on the top regions 202 and 204 and the bottom region 203. In addition, the first film FF may be thinner on the bottom region 203 than on the top regions 202 and 204.

On the other hand, if the CVD is isotropic, the first film may be formed as illustrated in FIG. 4A. In FIG. 4A, the first film FF is formed on the top regions 202 and 204 and the upper portion of the sidewall region 205, however, not on the bottom region 203 and the lower portion of the sidewall region 205. The thickness of the first film FF is generally non-uniform, and the first film FF bulges at the upper edge of the trench 201. Thus, the position of the first region may vary depending on the features of the substrate.

In operation 103, the controller 80 controls the processing apparatus 10 to perform a second process. The second process is performed on the substrate to form a second film in a second region thereon. In one embodiment, the second process may be an atomic layer deposition (ALD) process. In operation 103, more than one ALD process may be performed repeatedly until the thickness of the second film SF reaches a predetermined level. Here, it is assumed that one ALD process forms one atomic layer. It is desirable that more than one ALD process is performed in the second process after each first process. When the first film FF is completely or partially removed during the second process, the first process, i.e., operation 102, may be performed again. It may be preferable to perform the first process again before the first film FF is completely removed.

The ALD process includes an adsorption step and an activation step, i.e., a modification step. In the adsorption step, a precursor of material which adsorbed with the substrate 200 is introduced into the chamber 12. Then, in the activation step, plasma generated from modifying gas is generated in the chamber 12 to modify the adsorbed layer on the surface of the substrate so as to form the second film from the adsorbed precursor on the surface.

In one embodiment, the precursor is selected from a material which is adsorbed with the hydroxyl group. For example, the precursor is a Si-containing precursor, and the modifying gas may be an oxygen-containing gas such as $O_2$, CO, $CO_2$, NO, and $NO_2$.

In the first process, the first film is deposited on the first region of the substrate. Since the first film has a hydrophobic surface, the precursor introduced in the second process does not adsorb in the first region. On the other hand, the precursor adsorbs with the substrate 200 in regions other than the first region. In the subsequent modifying step, the adsorbed precursor is modified and forms the second film in the regions other than the first region. The region other than the first region is referred to as the second region.

Figure 3B:
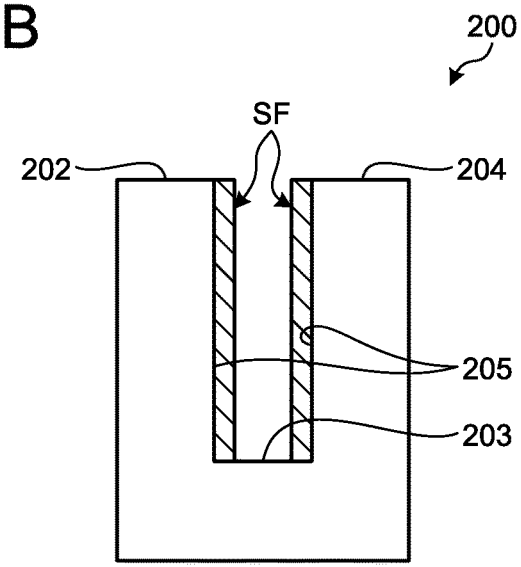
Figure 4B:
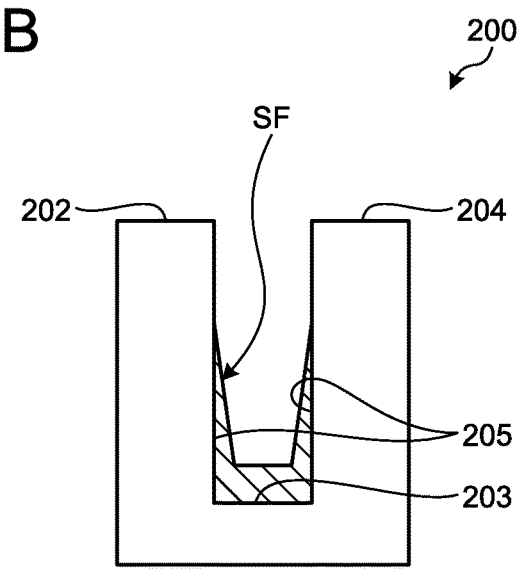

As illustrated in an example of FIG. 3B, when the second process is performed on the substrate 200 of FIG. 3A, the second film, which is indicated as SF in FIGS. 3B and 4B, is formed on the sidewall region 205. At the same time, the first film FF on the top regions 202 and 204, and the bottom region 203 are removed by the effect of plasma during the second process. Thus, the second film SF is formed only on the sidewall region 205 of the substrate 200. When the first film FF remains on the top regions 202 and 204, and the bottom region 203 after the second process, another step may be performed to remove the first film FF. For example, the substrate may be exposed to an argon plasma or an oxygen plasma after the second process.

Figure 3C:
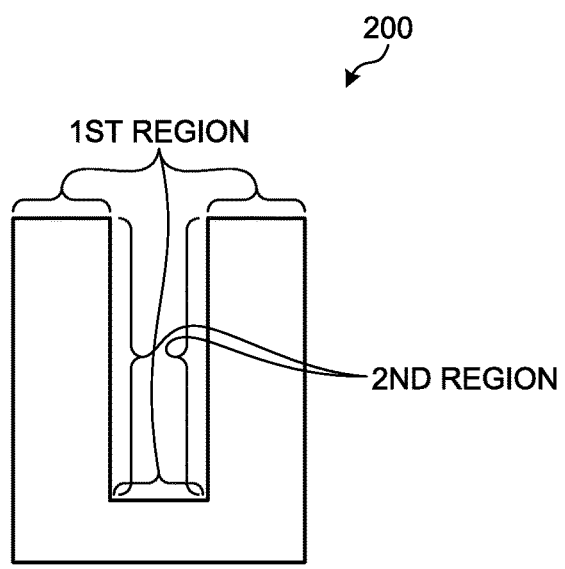
Figure 4C:
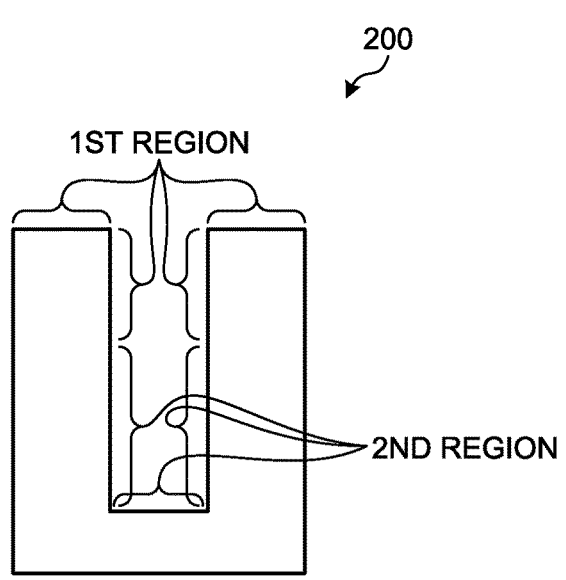

When the second process is performed on the substrate 201 as illustrated in FIG. 4A, the second film SF is formed on the bottom region 203 and on the lower portion of the sidewall region 205 as illustrated in FIG. 4B. Thus, depending on the features of the substrate and the types of the first process, i.e., whether it is an anisotropic CVD or an isotropic CVD, the resulting shapes of the second film SF and the position the second film SF is formed can be changed. As illustrated in FIG. 3C, when the anisotropic CVD is employed in the first process, the first region is the top regions 202 and 204 and the bottom region 203, while the second region is the sidewall region 205. In other words, when the first process is the anisotropic CVD, the first region is a horizontal region and the second region is a vertical region. Alternatively, when the first process is the anisotropic CVD, the first region is a surface extending in a first direction, and the second region is a surface extending in a second direction other than the first direction. The angle between the first direction and the second direction may be approximately 90 degrees. Alternatively, the first direction may be a direction perpendicular to a direction of deposition, and the second direction may be a direction parallel to the direction of deposition. On the other hand, as illustrated in FIG. 4C, when the isotropic CVD is employed in the first process, the first region is the top regions 202 and 204 and the upper portion of the sidewall region 205, while the second region is the bottom region 203 and the lower portion of the sidewall region 205. In other words, when the first process is the isotropic CVD, the first region is a region closer to the top region than the second region, and the second region is a region closer to the bottom region than the first region. The first region is a region where the film is formed by the first process, and the second region is a region where the film is formed by the second process. The first region and the second region may overlap in part.

As illustrated in FIG. 2, after the operations 102 and 103, it is determined in operation 104 whether a predetermined condition has been met. The predetermined condition may be the number of the first and the second processes already performed on the same substrate, or the thickness of the second film deposited on the substrate. Alternatively, the predetermined condition may be the thickness of the first film FF remains on the surface of the substrate 200.

For example, the number of ALD processes performed in the second process may be previously set in the control program stored in the storage. The thickness of the second film formed by one second process may be calculated, and the number of ALD processes may be set such that the thickness of the second film reaches a desired level. Then, it is determined in operation 104 whether a predetermined number of second processes have already been performed on the same substrate.

Alternatively, or in addition, it is determined in operation 104 whether the thickness of the first film remaining on the substrate reaches a predetermined level, e.g., zero. If the thickness of the second film has not reached a desirable level and the first film has been removed completely from the substrate, the operations 102 and 104 will be performed again. Alternatively, another operation to determine whether a predetermined condition has been met may be added after operation 102 so as to determine if the thickness of the first film is at a desirable level.

The operation 104 may be performed by the controller 80 based on the control program stored in the storage. When it is determined that the predetermined condition has been met in operation 104, the process ends. On the other hand, when it is determined that the predetermined condition has not been met in operation 104, the process returns to operation 102. In other words, the controller 80 repeats the operations 102 and 103 until the predetermined condition is met. The control program may be set such that only one of the operations 102 and 103 is performed when it is determined in operation 104 that the predetermined condition has not been met.

In Situ Operation

Here, the operations 102 and 103 are performed without transferring the substrate out of the chamber 12. In other words, the first and second processes are performed in situ, or without breaking the vacuum. The apparatus according to one embodiment such as the processing apparatus 10 has the gas supply unit 44 which allows the supply of various types of gases into the chamber. In addition, the apparatus according to one embodiment can perform the first and second processes without breaking the vacuum in the chamber 12. In addition, the apparatus has an exhaust mechanism such as the exhaust channel, exhaust port 12e, and the exhaust device 38, to perform the purge process to avoid mixing of different gases in the chamber 12. Thus, the apparatus of one embodiment can perform operations 102 and 103 in situ, or without breaking the vacuum.

Power Control during First & Second Processes

In addition, in one embodiment, the apparatus may change the manner of plasma generation for each process. For example, the controller 80 may control the antenna 50 and the lower electrode 18 such that the voltage is applied only to the lower electrode 18 during the first process, and the voltage is applied only to the antenna 50 during the second process.

When the controller 80 operates both the antenna 50 and the lower electrode 18 during the first process, the first gas may undergo an excessive dissociation; then, the radicals of the first gas may damage the substrate. Hence, during the first process, the controller 80 may control the processing apparatus 10 such that the power is supplied to the lower electrode 18 but not to the antenna 50. Alternatively, during the first process, the controller 80 may control the processing apparatus 10 such that the power is supplied to both the lower electrode 18 and the antenna 50; in this case, the controller 80 suppresses the power supplied to the antenna 50 to such a level that the substrate would not be damaged. On the other hand, during the second process, it is desirable that the second film of a high quality is formed. Hence, during the second process, it is desirable to generate plasma of a high electron density and a low ion energy. Thus, during the second process, the controller 80 may control the processing apparatus 10 such that the power is supplied to the antenna 50 but not to the lower electrode 18. Alternatively, during the second process, the controller 80 may control the processing apparatus 10 such that the power is supplied to both the lower electrode 18 and the antenna 50; in this case, the controller 80 suppresses the power supplied to the lower electrode 18 to a low level such that plasma of a low ion energy would be generated.

Figure 5:
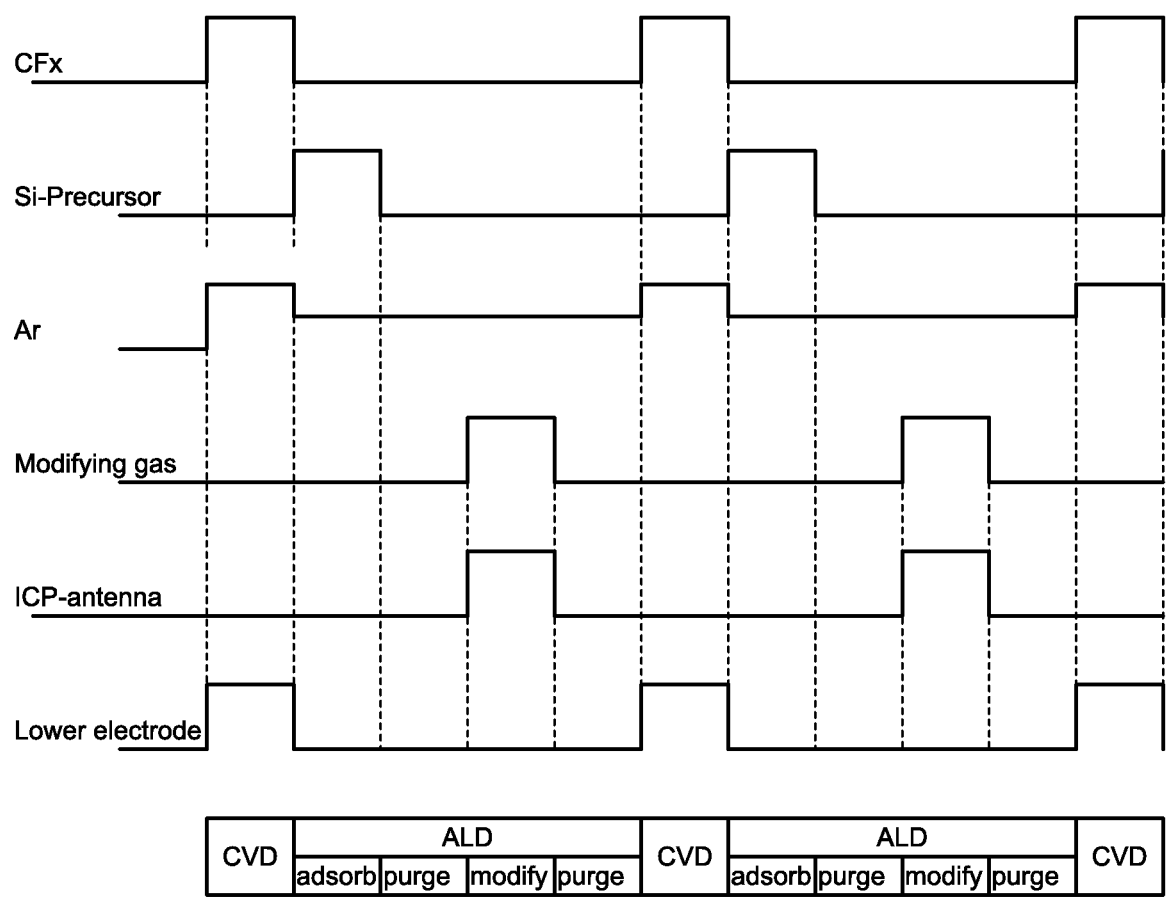
FIG. 5 is a timing diagram illustrating a sequence of processes employed according to one embodiment.

For example, the controller 80 may control each part of the processing apparatus 10 according to the time sequence as illustrated in FIG. 5. As illustrated in FIG. 5, during the first process (CVD process), the controller 80 may control the gas supply unit 44 to supply the first gas, i.e., CFx gas and argon gas to the chamber 12. At the same time, the controller 80 may control the RF power source 30 to supply power to the lower electrode 18. During the first process, the controller 80 does not operate the antenna 50 (indicated as ICP-antenna in FIG. 5).

Then, after the first process, the adsorption step of the second process starts. The controller 80 controls the gas supply unit 44 to supply the precursor, such as Si-containing precursor (indicated as "Si-Precursor" in FIG. 5) into the chamber 12. During this period, the controller 80 may cause the carrier gas such as argon gas to be supplied into the chamber 12. The controller 80 may controls the gas supply unit 44 such that a predetermined flow rate of the carrier gas is supplied to the chamber 12 throughout the processing of the substrate. The antenna 50 and the lower electrode 18 are inoperative during this period. After the introduction and adsorption of the Si-containing precursor, the controller 80 purges the chamber 12 so that the undesirable gaseous substances would not remain in the chamber 12.

Then, the controller 80 starts the activation step, i.e., the modification step, to modify the adsorbed precursor. In the activation step, the controller 80 controls the gas supply unit 44 to supply the modifying gas such as oxygen into the chamber 12. At the same time, the controller 80 causes the RF power sources 70A and 70B to supply power to the antenna 50. During this period, the controller 80 does not operate the lower electrode 18. Thereafter the controller 80 undergoes a purge process again. Note that the purge processes after the adsorption step and the activation step may be omitted. Then, the controller 80 repeats the first and second process depending on whether the predetermined condition is met or not. Further, the controller 80 may repeat one of the first process and the second process independently.

Etching Process

In addition to the first and the second processes, another process may be performed as a third process in situ in the apparatus according to one embodiment. For example, the apparatus according to one embodiment may further perform an etching process to further process the substrate, whereby the throughput can be further improved. The etching process may be an atomic layer etching (ALE) process.

The ALE process may include a modification step to form a reactive layer, and a removal step to take off the modified reactive layer. The ALE process may include a purge step after each of the modification step and the removal step. The modification step may be performed with N plasma or H plasma. The removal step may be performed with halogen plasma (species) such as F.

According to one embodiment, the first, second, and third processes may be repeated in this order. The number of times each process is repeated may differ from each other. For example, the second process may be repeated ten times after the first process is performed once. Alternatively, the order the first, second, third processes may be changed.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An apparatus for processing a substrate, the apparatus comprising:
   at least a first and a second chamber; and
   a controller comprising a memory and a processor coupled to the memory, wherein the memory stores computer-executable instructions for controlling the processor to perform a process comprising:
first forming a first film in a first region of the substrate in the first chamber by chemical vapor deposition;
second forming, by introducing a precursor of material adsorbed with the substrate into the chamber, introducing modifying gas into the chamber, and generating plasma from the modifying gas, a second film in a second region of the substrate in the first chamber; and
etching the substrate in the second chamber, wherein
the first forming and the second forming are performed without moving the substrate out of the first chamber,
the first and second chambers are different chambers, and
the etching performs an atomic layer etching and includes:
modifying a surface of the substrate by one of N plasma and H plasma, purging the chamber, and
removing the surface modified by the one of N plasma and the H plasma by halogen gas.

2. The apparatus according to claim 1, further comprising:
an antenna arranged above the first chamber and controlled by the controller, and
a lower electrode arranged opposite to the antenna in the first chamber and configured to hold the substrate thereon, the lower electrode being controlled by the controller, wherein
the process further comprising:
applying a voltage to the lower electrode during the chemical vapor deposition, and
applying a voltage to the antenna in a modification step of the second forming step.

3. The apparatus according to claim 2, wherein at least one of:
the applying a voltage to the lower electrode during the chemical vapor deposition comprises maintaining a voltage at such a level as to prevent damage to the substrate or to generate plasma of a low ion energy, and
the applying a voltage to the antenna in the modification step of the second forming step comprises maintaining a voltage at such a level as to prevent damage to the substrate.

4. The apparatus according to claim 1, further comprising:
an antenna arranged above the first chamber and controlled by the controller, and
a lower electrode arranged opposite to the antenna in the first chamber and configured to hold the substrate thereon, the lower electrode being controlled by the controller, wherein
the process further comprising:
applying a voltage to the lower electrode without applying a voltage to the antenna during the chemical vapor deposition; and
applying a voltage to the antenna without applying a voltage to the lower electrode in a modification step of the second forming step.

5. The apparatus according to claim 1, wherein
the first forming forms the first film of hydrophobic surface on the first region of a hydrophilic surface of the substrate,
the second forming forms the second film by adsorbing, on the second region of the hydrophilic surface of the substrate, the precursor, and
the precursor reacts with a hydroxyl group.

6. The apparatus according to claim 1, wherein
the first forming performs one of an anisotropic CVD and an isotropic CVD by controlling a voltage applied to the lower electrode.

7. The apparatus according to claim 1, wherein
the first forming forms the first film on a top region and a bottom region of a feature of the substrate, and
the second forming forms the second film on a sidewall of the feature of the substrate.

8. The apparatus according to claim 1, wherein
the substrate contains at least one of $SiO_2$, SiN, Si and Ge, and
the second forming forms a Si-containing film as the second film.

9. The apparatus according to claim 1, wherein the first forming and the second forming are performed repeatedly in this order.

10. The apparatus according to claim 9, wherein
the process further comprising:
ceasing the second forming before the second forming removes the first film completely; and
performing the first forming while the first film remains on the substrate.

11. The apparatus according to claim 1, wherein the first forming and the second forming are performed by using inductively-coupled plasmas or capacitively-coupled plasmas.

12. The apparatus according to claim 1, wherein the substrate has a hydrophilic surface or a surface subjected to hydrophilic treatment.

13. The apparatus according to claim 1, wherein
the process further comprising:
determining whether a predetermined condition has been met after the first forming and the second forming; and
repeating a cycle including the first forming and the second forming when the determining determines that the predetermined condition has not been met.

14. The apparatus according to claim 1, wherein the first region of the substrate and the second region of the substrate do not substantially overlap.

15. The apparatus according to claim 1, wherein the second forming step is conducted after the first forming step.

16. The apparatus according to claim 1, wherein the second forming includes repeating one or more cycles comprising the introducing a precursor, the introducing modifying gas, and the generating plasma.

17. The apparatus according to claim 1, wherein
the first forming deposits the first film by fluorocarbon plasmas, and
the first film contains carbon.

18. An apparatus for processing a substrate, the apparatus comprising:
at least a first and a second chamber; and
a controller comprising a memory and a processor coupled to the memory, wherein
the memory stores computer-executable instructions for controlling the processor to perform a process comprising:
first forming a first film in a first region of the substrate in the first chamber;
second forming, by introducing a precursor of material adsorbed with the substrate into the chamber, introducing modifying gas into the chamber, and generating plasma from the modifying gas, a second film in a second region of the substrate in the first chamber; and etching the substrate in the second chamber, wherein the first forming and the second forming are performed without moving the substrate out of the first chamber, the first and second chambers are different chambers, and the etching includes:

modifying a surface of the substrate by one of N plasma and H plasma, purging the chamber, and removing the surface modified by the one of N plasma and the H plasma by halogen gas.

* * * * *